US008711321B2

(12) United States Patent
Dunn et al.

(10) Patent No.: US 8,711,321 B2
(45) Date of Patent: Apr. 29, 2014

(54) SYSTEM FOR THERMALLY CONTROLLING DISPLAYS

(75) Inventors: William Dunn, Alpharetta, OH (US); Ware Bedell, Cumming, GA (US); Michael LeCave, Gainsville, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 845 days.

(21) Appl. No.: 12/234,182

(22) Filed: Sep. 19, 2008

(65) Prior Publication Data

US 2009/0213304 A1     Aug. 27, 2009

Related U.S. Application Data

(63) Continuation-in-part of application No. 11/941,728, filed on Nov. 16, 2007, now Pat. No. 8,004,648, and a continuation-in-part of application No. 12/125,046, filed on May 21, 2008, now Pat. No. 8,562,770, and a continuation-in-part of application No. 12/191,834, filed on Aug. 14, 2008, now Pat. No. 8,208,115.

(60) Provisional application No. 61/033,064, filed on Mar. 3, 2008, provisional application No. 61/039,454, filed on Mar. 26, 2008, provisional application No. 61/053,713, filed on May 16, 2008, provisional application No. 61/057,599, filed on May 30, 2008, provisional application No. 61/076,126, filed on Jun. 26, 2008.

(51) Int. Cl.
*G02F 1/1333* (2006.01)

(52) U.S. Cl.
USPC ............ 349/161; 349/137; 349/139; 349/158

(58) Field of Classification Search
USPC .................. 349/139, 158, 161, 137; 219/209; 361/705, 712, 694, 695
See application file for complete search history.

(56) References Cited

U.S. PATENT DOCUMENTS

| | | | |
|---|---|---|---|
| 5,911,899 A * | 6/1999 | Yoshikai et al. | 219/522 |
| 6,359,390 B1 * | 3/2002 | Nagai | 315/169.1 |
| 6,392,727 B1 | 5/2002 | Larson et al. | |
| 6,504,713 B1 * | 1/2003 | Pandolfi et al. | 361/695 |
| 6,727,468 B1 * | 4/2004 | Nemeth | 219/209 |
| 6,909,486 B2 | 6/2005 | Wang et al. | |
| 6,955,833 B1 | 10/2005 | Gallego | |
| 6,961,108 B2 | 11/2005 | Wang et al. | |
| 8,009,262 B2 * | 8/2011 | Dunn | 349/161 |
| 2002/0042162 A1 * | 4/2002 | Tone et al. | 438/118 |

(Continued)

OTHER PUBLICATIONS

Pilkington OptiView Anit-Reflective Glass, product sheet, copyrighted 2005, 2 pages Toledo, OH.

(Continued)

*Primary Examiner* — Dung Nguyen
*Assistant Examiner* — Tai Duong
(74) *Attorney, Agent, or Firm* — Standley Law Group LLP (57) ABSTRACT

Exemplary embodiments provide a system for thermally controlling an electronic display. A glass substrate containing a pyrolytic electrically conductive layer is utilized. The electrically conductive layer may be used as a passive thermal insulator or may be electrically energized to further heat the glass substrate. The glass may be used with a closed loop plenum which may further heat/cool the display. Additional glass layers may be added in order to polarize light or provide anti-reflective properties.

12 Claims, 6 Drawing Sheets

(56) References Cited

U.S. PATENT DOCUMENTS

2004/0018375 A1* 1/2004 Banno et al. .................. 428/605
2005/0062373 A1* 3/2005 Kim et al. .................. 312/223.2
2005/0115670 A1* 6/2005 Bettinelli et al. ........ 156/345.11
2006/0262258 A1* 11/2006 Wang et al. .................. 349/117
2009/0015761 A1* 1/2009 Stockham ....................... 349/96

OTHER PUBLICATIONS

Pilkington TEC Glass for the Regirdaeration Marke, product sheet, copyrighted 2002, 2 pages Toledo, OH.

* cited by examiner

Pilkington TEC Glass™ Product Properties

| Product | Glass Thicknesses (mm) | Visible Transmittance (%) | Sheet Resistance (Ohms/sq.) | Hemispherical Emittance |
|---|---|---|---|---|
| TEC 15 | 2.3, 3.0, 3.2, 4.0, 5.0, 6.0, 8.0 | 81-83 | 14 | 0.15 |
| TEC 70 | 3.2, 4.0 | 82-83 | 65 | 0.45 |
| TEC 250 | 3.2, 4.0 | 82-83 | 225 | 0.67 |
| Clear | 3.2 | 90 | - | 0.84 |

Notes: Nominal values shown   Haze = < 0.8%
Substrate = Clear Soda Lime Glass   Specifications Subject to Change Pilkington TEC Glass™ Refrigerator Door Applications*

| Glazing (Room/Cool Side) | Airspaces (Number) | U-Value (W/m²·°C) | Room-Side Glass Temp. (°C) | Condensation RH** (%) | RH Improvement (%) | Heat Flow Through Glass (W/m²) | Heat Flow Reduction (%) | Power Density (W/m²) |
|---|---|---|---|---|---|---|---|---|
| Double Clear | 1 | 2.8 | 19 | 62 | Base Case | 64 | Base Case | 0 |
| Triple Clear | 2 | 2.2 | 20 | 67 | 8 | 52 | 19 | 0 |
| TEC 15/Clear | 1 | 1.9 | 22 | 72 | 16 | 43 | 33 | 0 |

*Room-side temperature = 27°C, refrigeration temperature = 4°C

Pilkington TEC Glass™ Freezer Door Applications*

| Glazing (Room/Cool Side) | Airspaces (Number) | U-Value (W/m²·°C) | Room-Side Glass Temp. (°C) | Condensation RH** (%) | RH Improvement (%) | Heat Flow Through Glass (W/m²)*** | Heat Flow Reduction (%) | Power Density (W/m²) |
|---|---|---|---|---|---|---|---|---|
| Triple Clear | 2 | 2.1 | 15 | 47 | Base Case | 101 | Base Case | 0 |
| TEC 70/Clear/Clear | 2 | 2.0 | 23 | 77 | 64 | 94 | 7 | 82 |
| TEC 70/TEC 15 | 1 | 1.8 | 24 | 81 | 72 | 86 | 14 | 82 |
| TEC 70/TEC 15/Clear | 2 | 1.7 | 25 | 86 | 83 | 82 | 19 | 82 |

*Room-side temperature = 27°C, refrigeration temperature = -20°C
**Condensation along the room-side glass surface away from the frame when the relative humidity (RH) within the room is greater than the value noted.
***No Power
Notes: All glass 3.2 mm.
Airspace 12mm for doubles, 6mm for triples.
Demist heater power of 100 Watts (82 W/m2). Input voltage = 120 volts.
Airspaces filled with air.
Unit 800 mm x 1,700 mm, bus bars along 800 mm dimension.
All simulations utilizing LBL Window 4.1

Fig. 6

SYSTEM FOR THERMALLY CONTROLLING DISPLAYS

CROSS-REFERENCE TO RELATED APPLICATIONS

This application is a non-provisional patent application and claims priority to U.S. Provisional Application No.'s 61/033,064 filed Mar. 3, 2008; 61/039,454 filed Mar. 26, 2008; 61/053,713 filed May 16, 2008; 61/057,599 filed May 30, 2008; and 61/076,126 filed Jun. 26, 2008, which are hereby incorporated by reference in their entirety. This application is also a continuation in part of U.S. patent application Ser. No. 11/941,728 filed Nov. 16, 2007, which is hereby incorporated by reference in its entirety. This application is also a continuation in part of U.S. patent application Ser. No. 12/125,046 filed May 21, 2008, which is hereby incorporated by reference in its entirety. This application is also a continuation in part of U.S. patent application Ser. No. 12/191,834 filed Aug. 14, 2008, which is hereby incorporated by reference in its entirety.

TECHNICAL FIELD

Exemplary embodiments relate generally to a system for heating a display and reducing condensation on displays by utilizing a glass substrate containing an electrically conductive pyrolytic coating.

BACKGROUND AND SUMMARY OF EXEMPLARY EMBODIMENTS

Traditional electronic displays are used in indoor environments where the temperature range stays relatively close to room temperature. Recently however, electronic displays are being used outdoors and in other environments where the temperature range may vary, possibly from very warm to very cold.

Very cold temperatures can be harmful to electronic displays. Specifically for liquid crystal displays (LCDs), at low temperatures the crystals may malfunction and/or begin to actually freeze. Exemplary embodiments utilize a specialty glass to insulate the sensitive display components from the cold surrounding air and may also be used to directly heat the display and its sensitive components.

Additionally, when the temperature within the display is different than the temperature of the surrounding air, the risk of condensation may increase. Using the specialty glass can also reduce the risk of condensation. Recent advances have also taught methods for cooling a display that is intended to be used in a hot environment. This can also pose a risk of condensation which can also be addressed by the specialty glass.

The exemplary embodiments herein disclosed are not intended to be exhaustive or to unnecessarily limit the scope of the embodiments. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

A better understanding will be obtained from a reading of the following detailed description and the accompanying drawings wherein identical reference characters refer to identical parts and in which.

DETAILED DESCRIPTION OF PREFERRED EMBODIMENTS

Embodiments may utilize a layer of substantially clear glass containing a pyrolytic, low emissivity, electrically conductive coating. One example of this glass is the Pilkington TEC™ glass which is commercially available from Pilkington Building and Specialty Glass Products of Toledo, Ohio (herein 'TEC glass'). www.pilkington.com The document "Pilkington TEC Glass™ For the Refrigeration Market," Form No. 2413, is herein incorporated by reference in its entirety. This glass can be used as a passive thermal insulator or directly electronically heated in order to heat the display or control condensation in the electronic display. TEC glass also inhibits reflected color to give an undistorted view of the display image.

TEC glass is produced using a chemical vapor deposition process, where a microscopically thin, durable pyrolytic coating is applied to the glass. Exemplary embodiments may utilize TEC 15, TEC 70, or TEC 250 product lines of TEC glass. It should be noted, that any glass which meets the performance characteristics set by the TEC glass would work with the exemplary embodiments. TEC glass was simply selected for exemplary purposes.

Figure 1A:
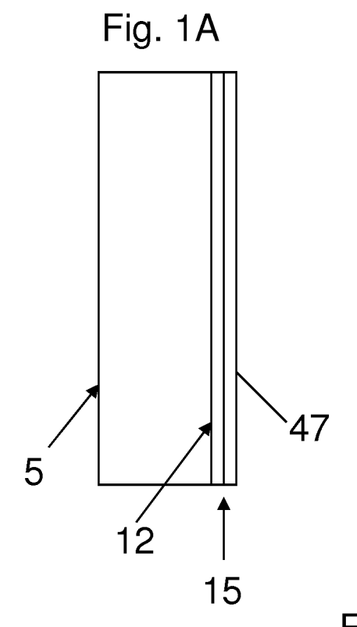
FIG. 1A is a side view of one embodiment where the specialty glass is attached to the exterior glass of an electronic display.

FIG. 1A is a side view showing an electronic display 5 where the TEC glass 15 with its pyrolytic coating 47 is placed in front of the front viewable surface 12 of the display. Electronic displays typically contain a front viewable surface which may protect the display (depending on the environment and the specific display) and may serve other functions such as polarize light and/or absorb light. In this embodiment, the TEC glass 15 is simply placed in front of the front viewable surface 12 for the display. This allows for the glass to be an additional part of a pre-existing display assembly, and can be easily retrofitted to displays which are experiencing condensation, require heating, or need insulation from the surrounding environment. The TEC glass 15 may be bonded to the front viewable surface 12 or there may be a gap between the TEC glass 15 and the front viewable surface. The TEC glass 15 may be bonded to the front viewable surface 12 in a number of ways. One method for bonding the glass is to utilize an index matched optical adhesive. An exemplary adhesive may be Cytec UVEKOL A. The method for bonding glass and associated adhesive types disclosed in co-pending Application No. 12/125,046, also may be used to bond the glass here. This application is herein incorporated by reference in its entirety.

The electronic display 5 may be any one of the following: liquid crystal display (LCD), light emitting diode (LED), organic light emitting diode (OLED), field emitting display (FED), cathode ray tube (CRT), and plasma displays. It is It should be noted, that any glass which meets the performance characteristics set by the OptiView glass would fall within the exemplary embodiments. OptiView glass was simply selected for exemplary purposes. Chart 1 provides typical performance characteristics for two pieces of glass, each with an anti-reflective pyrolytic coating on one side, where the two pieces of glass are laminated or bonded together. Currently, Pilkington Glass does not provide this dual-layered glass with two pyrolytic coatings. Users must purchase single pieces of glass with a single pyrolytic coating and laminate or bond the pieces themselves. See the Chart 1 Notes for specifics.

CHART 1

| Nominal Glass Thickness | Visible Light | | | Total Solar Energy | | | | | | Solar | |
|---|---|---|---|---|---|---|---|---|---|---|---|
| | | | | | | UV | | | | | |
| | Trans-mittance % | Reflectance % Outside | Reflectance % Inside | Trans-mittance % | Reflectance % | Trans-mittance % | U-Factor | | | Heat Gain Coefficient | Shading Coefficient |
| | | | | | | | U.S. Summer* | U.S. Winter* | European** | | |
| ¼ in | 92 | 1.7 | 1.7 | 70 | 3 | <1 | 0.68 | 0.81 | 4.7 | 0.77 | 0.89 |
| ½ in | 89 | 1.6 | 1.6 | 63 | 3 | <1 | 0.65 | 0.77 | 4.5 | 0.72 | 0.83 |

Notes:
¼" laminated glass: ⅛" OptiView ™ (#1) + 0.030" clear pvb with 99% UV absorptance + ⅛" OptiView ™ (#4)
½" laminated glass: ¼" OptiView ™ (#1) + 0.030" clear pvb with 99% UV absorptance + ¼" OptiView ™ (#4)
*Btu/hr · sq ft · ° F.
**W/sq m · °K particularly contemplated for embodiments to be used with large LCD displays in outdoor environments.

Figure 1B:
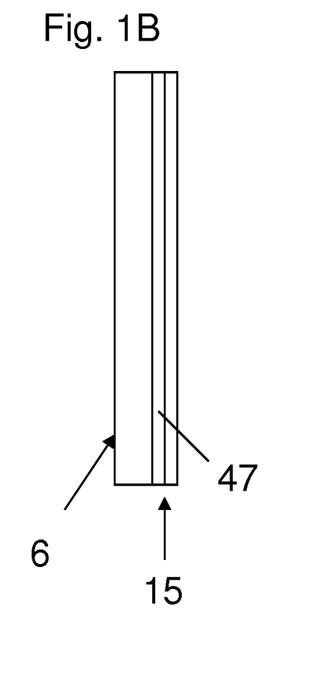
FIG. 1B is a side view of another embodiment where the specialty glass is placed directly next to an LCD stack.

FIG. 1B is a side view showing an LCD stack 6 where the TEC glass 15 with its pyrolytic coating 47 is directly in front of the LCD stack 6. In cold environments, where the TEC glass is directly electronically heated, this embodiment would deliver heat directly to the LCD stack 6. It is not necessary to directly heat the TEC glass, as it may also be used as a passive thermal insulator.

Figure 1C:
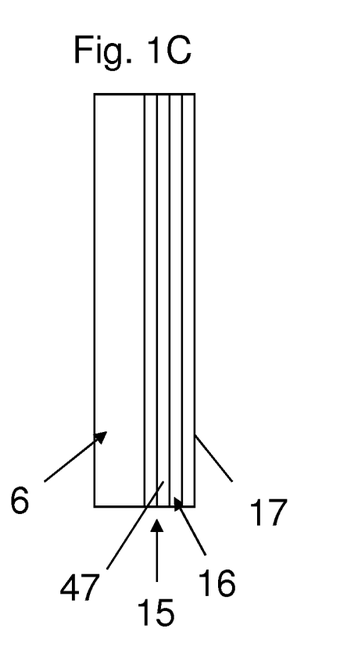
FIG. 1C is a side view of another embodiment where optional additional glass layers are utilized.

FIG. 1C is a side view showing the embodiment from FIG. 1B with additional optional layers. In this exemplary embodiment, a linear polarizer 16 may be placed in front of the TEC glass 15 with its pyrolytic coating 47. This optional linear polarizer 16 may be used to further reduce any unwanted reflection of light off the TEC glass. Further, an anti-reflective glass 17 may be placed in front of the optional linear polarizer 16.

An exemplary anti-reflective glass could be Pilkington OptiView™ glass which is commercially available from Pilkington Building and Specialty Glass Products of Toledo, Ohio (herein 'OptiView glass'). www.pilkington.com The document "Pilkington OptiView™ Anti-Reflective Glass," Form No. 4483, is herein incorporated by reference in its entirety.

It should be noted that anti-reflective glass, and especially OptiView glass, may be utilized as single panes or may be utilized as multiple panes which are laminated or otherwise bonded together. For example, in an embodiment where a polarizer is used, a single monolithic piece of soda lime glass with an anti-reflective pyrolytic coating on only one side may be laminated or bonded to the polarizer. Alternatively, an embodiment may contain two pieces of glass, each with an anti-reflective pyrolytic coating on one side, where the two pieces of glass are laminated or bonded together. One method for bonding the glass is to utilize an index matched optical adhesive. An exemplary adhesive may be Cytec UVEKOL A. The method for bonding glass and associated adhesive types disclosed in co-pending application Ser. No. 12/125,046, also may be used to bond the glass here.

Figure 2:
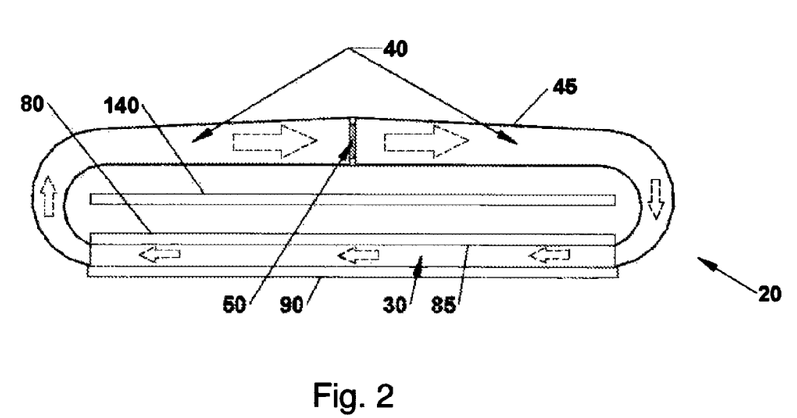
FIG. 2 is a top view of an embodiment where the display is heated and/or cooled using a closed loop plenum.

FIG. 2 shows an embodiment where the display is heated and/or cooled using a closed loop plenum. The cooling system is disclosed in co-pending application No. 61/033,064. The cooling system with electronic components within the closed loop plenum is disclosed in co-pending application No. 61/053,713. The heating system is disclosed in co-pending application No. 61/076,126. Each of these applications is herein incorporated by reference in its entirety.

In one embodiment, the isolated gas chamber 20 comprises a closed loop which includes a first gas chamber 30 and a second gas chamber 40. The first gas chamber includes a transparent front glass 90. In one embodiment, the transparent front glass 90 may be the TEC glass. The second gas chamber 40 comprises a cooling/heating plenum 45 where the gas is cooled/heated. The term "isolated gas" refers to the fact that the gas within the isolated gas cooling chamber 20 is essentially isolated from external air. Because the first gas chamber 30 is positioned in front of the display image, the gas should be substantially free of dust or other contaminates that might negatively affect the display image.

The first gas chamber 30 is in gaseous communication with the second gas chamber 40. A cooling chamber fan 50 may be provided within the second gas chamber 40 to propel the hot/cool gas around the closed loop. The hot/cool gas may contact the front viewable surface 85 for the display and transfer heat or remove heat from the electronic display 80. When the gas in the first chamber 30 is much warmer or cooler than ambient air (i.e. the gas outside the front glass 90), condensation may form on either the inside or outside of front glass 90. Thus, TEC glass may be used to prevent this condensation. In some embodiments, the exterior glass for the display 85 may be TEC glass or the front glass 90 may be TEC glass. In other embodiments, both the front viewable surface 85 for the display and the front glass 90 may be TEC glass. In some embodiments, the front viewable surface 85 for the display may not be glass at all, but may be some other material, such as plastic.

The display 80 may be the display components for a liquid crystal display (LCD), light emitting diode (LED), organic light emitting diode (OLED), field emitting display (FED), cathode ray tube (CRT), or plasma display. The backlight 140 may be used with the display, especially with an LCD display. Other types of displays however may not necessitate any backlight.

Figure 3:
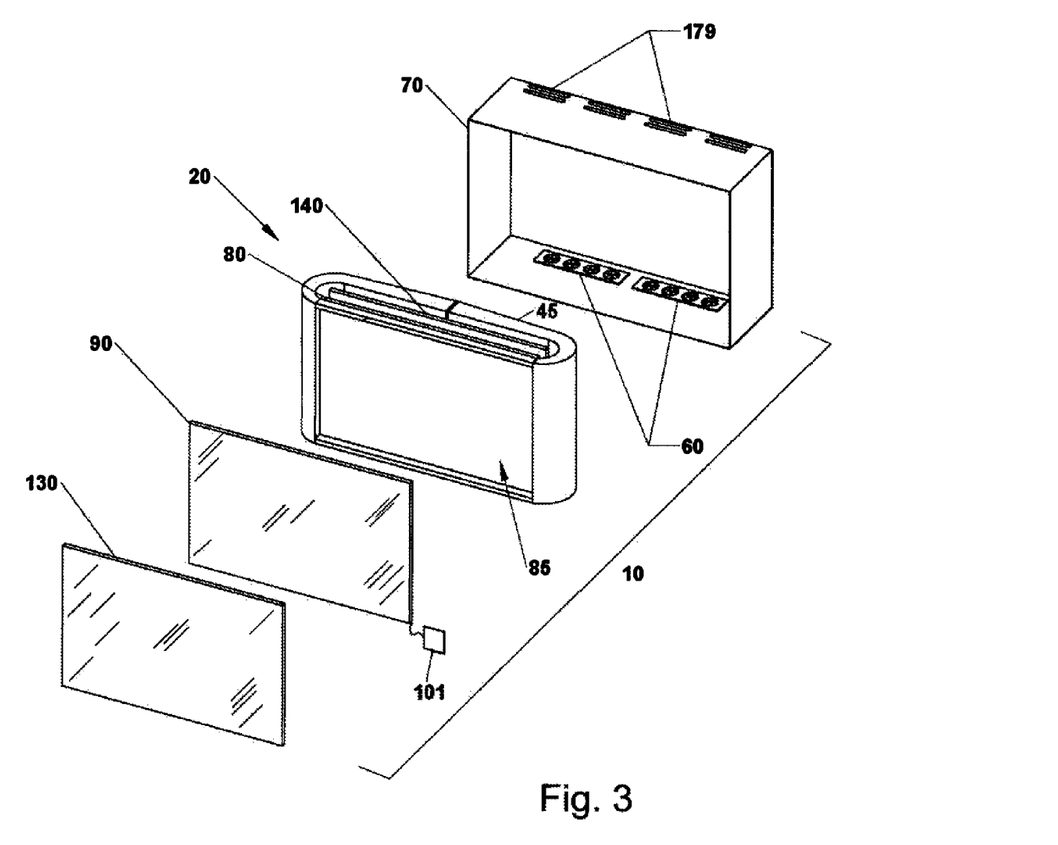
FIG. 3 is an exploded view of an embodiment where a closed loop plenum is installed within a housing and is further protected/insulated with an additional piece of exterior glass.

FIG. 3 shows another embodiment where the isolated gas chamber 20 is assembled into the electronic display housing 70 and an additional piece of outside glass 130 is installed. This additional outside glass 130 could also be TEC glass. Alternatively, the outside glass 130 could be anti-reflective glass with or without a linear polarizer. In some embodiments, the outside glass 130 may be the only piece of TEC glass in the entire assembly. In this embodiment, a power source 101 is electrically connected to the pyrolytic electrically conductive coating on front glass 90. The outside glass 130 could be bonded to front glass 90. One method for bonding outside glass 130 and front glass 90 is to utilize an index matched optical adhesive. Either outside glass 130, front glass 90, or both may be heat tempered to improve their strength. The method for bonding glass and associated adhesive types disclosed in co-pending Application No. 12/125046, may be used to bond the outside glass 130 and front glass 90. This application is herein incorporated by reference in its entirety. It is also contemplated to introduce a polarizing layer in between outside glass 130 and front glass 90, as disclosed in co-pending Application No. 61/057599 herein incorporated by reference in its entirety.

Figure 4:
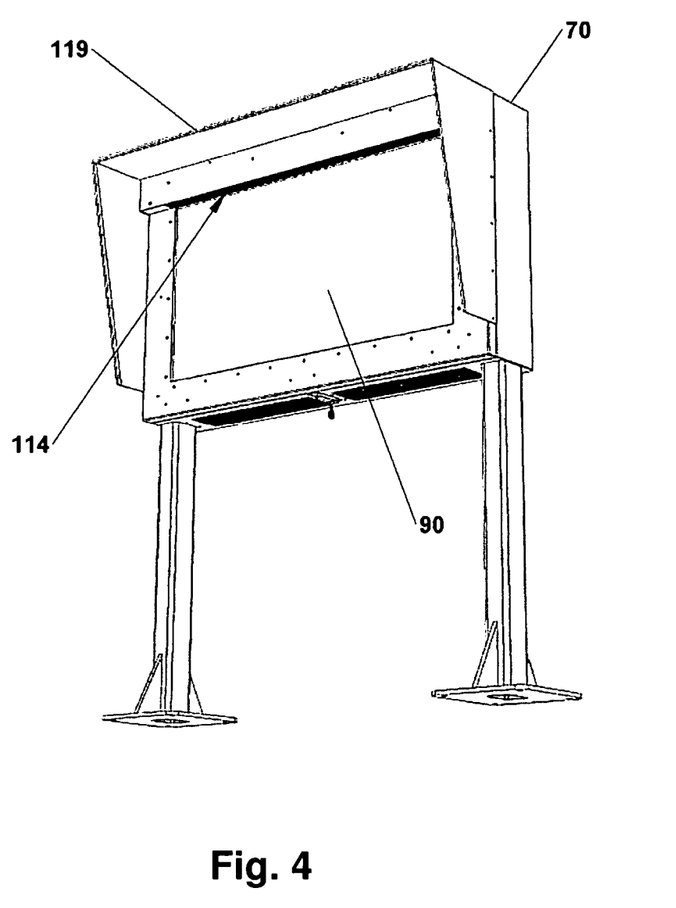
FIG. 4 is a perspective view of an embodiment which utilizes an air curtain.

FIG. 4 shows another embodiment where front glass 90 is utilized as the outside glass for the display. The display shown is also equipped with an optional air curtain device 114 which is the subject matter of co-pending U.S. application Ser. No. 11/941,728, incorporated by reference entirely herein. The air curtain 114 blows air (or some other gas) onto the outer surface of the front glass 90. This air may come from the closed loop heating/cooling system discussed above or alternatively this air may come from a separate source. Contacting this air with the outer surface of the front glass 90 can further prevent condensation on the front glass 90. The air curtain device may also be utilized with the embodiment shown in FIG. 3, where the air curtain would blow air onto the outer surface of the outside glass 130.

In all of the embodiments disclosed herein, the TEC glass may be actively heated by connecting the glass to an electrical source. Alternatively, in all of the embodiments disclosed herein, the TEC glass may be used as a passive thermal insulator. The specific application of the TEC glass will depend upon the environment of the display. Extreme temperatures may require active electronic heating while a more constrained temperature environment may require only passive thermal insulation. The method may also depend upon the average humidity of the environment where the display will be used.

Figure 5:
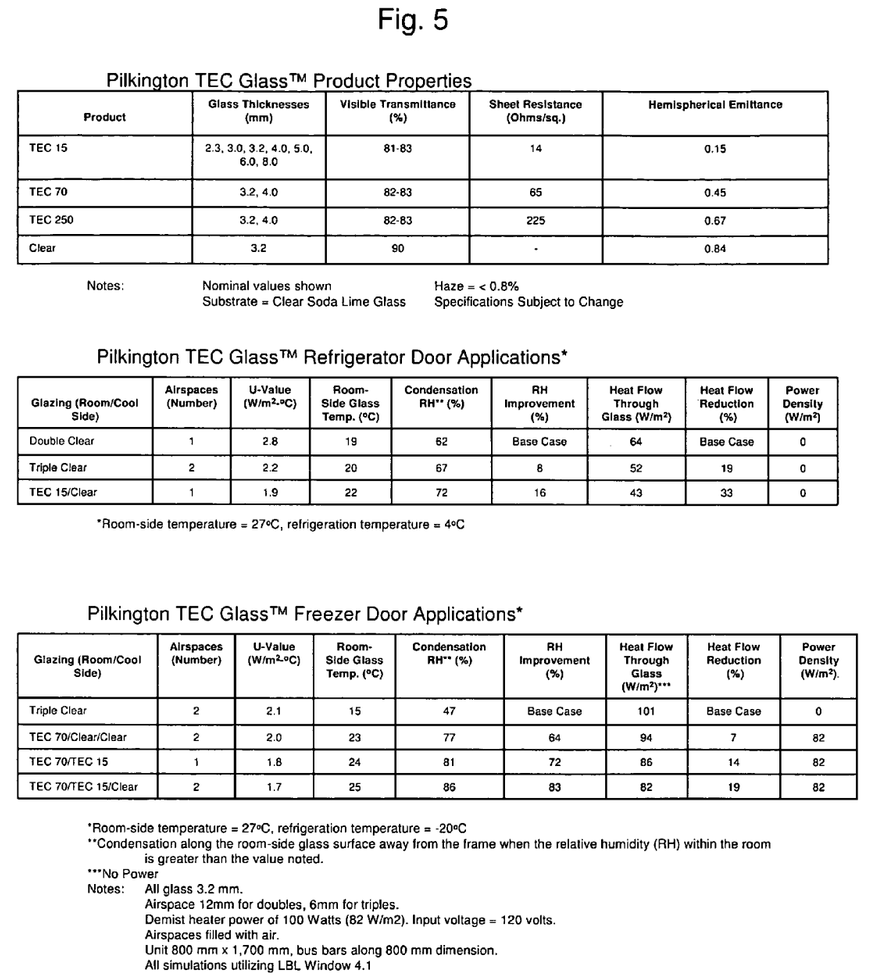
FIG. 5 is a series of charts which show typical performance characteristics for glass substrates with pyrolytic electrically conductive coatings.

FIG. 5 is a series of charts which show typical performance characteristics for glass substrates with pyrolytic electrically conductive coatings. The Pilkington TEC Glass™ is shown as the exemplary material. The performance of traditional clear glass is also shown for comparison. As shown, multiple glazings can be used in some applications. As shown, several layers of TEC glass may be used or layers of traditional clear glass with layers of TEC glass may be used. These multiple layers can be used in any disclosed embodiment showing TEC glass for increased insulation and heating capabilities. Any material having performance characteristics similar to those which are shown in FIG. 5 can fulfill the requirements of an exemplary embodiment.

Figure 6:
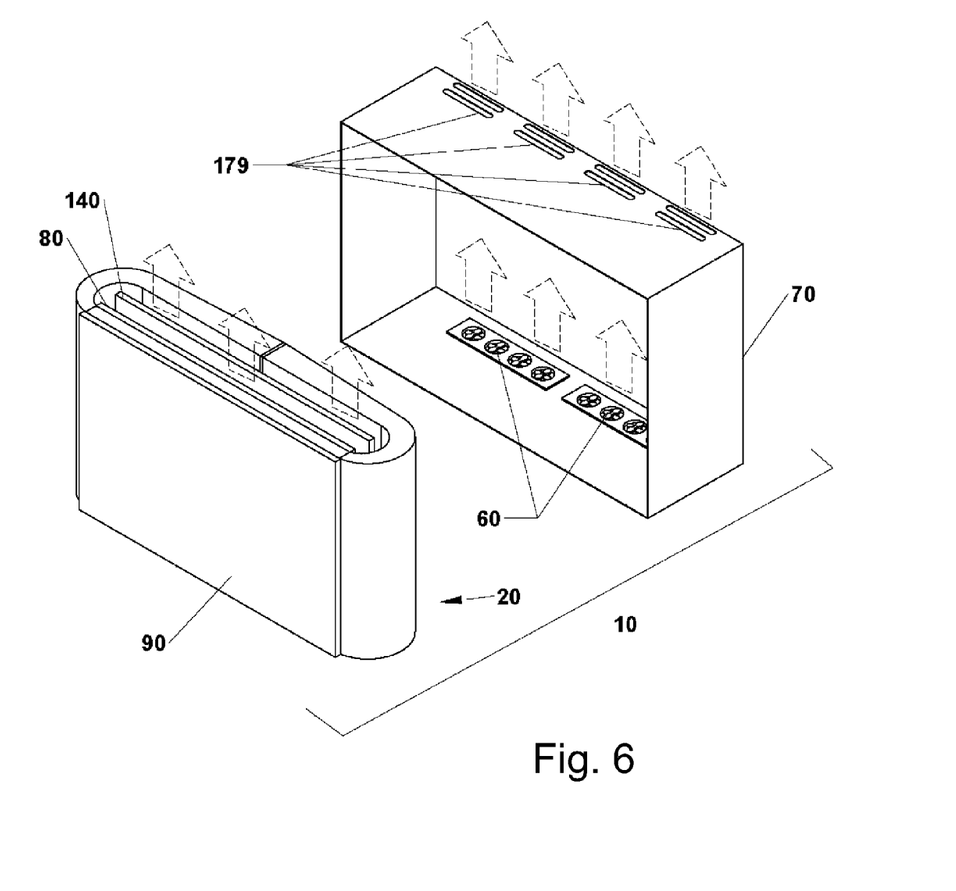
FIG. 6 is a partially exploded view of an exemplary embodiment showing components of the isolated gas cooling system.

FIG. 6 shows an exemplary method for removing heat in the isolated gas contained in the rear plenum 45. Fan 60 may be positioned to ingest ambient air and blow that air into the display housing 70. Preferably, the ambient air will contact exterior surfaces of the plenum 45. Furthermore, preferably in this configuration, fan 60 will also force ambient air over the rear surface of the electronic display (e.g., the backlight) to further improve the cooling capability of the cooling system. The heated exhaust air may exit through one or more apertures 179 located on the display housing 70.

Having shown and described preferred embodiments, those skilled in the art will realize that many variations and modifications may be made to affect the described embodiments and still be within the scope of the claims. Thus, many of the elements indicated above may be altered or replaced by different elements which will provide the same result and fall within the spirit of the claimed embodiments. It is the intention, therefore, to limit the invention only as indicated by the scope of the claims.

What is claimed is:

1. A system for thermally controlling an electronic display having an intended observer comprising:
   a glass substrate placed between the electronic display and the intended observer;
   an air gap defined between the electronic display and the glass substrate;
   a plenum in gaseous communication with the air gap;
   a first fan positioned to force isolated gas through the plenum and air gap;
   a second fan positioned to force ambient gas over the plenum; and
   a pyrolytic electrically conductive coating disposed on a surface of the glass substrate.

2. The system of claim 1 further comprising:
   a power source electrically connected to said pyrolytic electrically conductive coating.

3. The system of claim 1 wherein:
   said glass substrate having a pyrolytic electrically conductive coating has a sheet resistance between 10 and 20 Ohms/sq.

4. The system of claim 1 wherein:
   said glass substrate having a pyrolytic electrically conductive coating has a sheet resistance between 55 and 75 Ohms/sq.

5. The system of claim 1 wherein said electronic display is a liquid crystal display (LCD).

6. The system of claim 1 wherein said electronic display is any one of the following: light emitting diode (LED), organic light emitting diode (OLED), field emitting display (FED), cathode ray tube (CRT), and plasma display.

7. A system for thermally controlling a liquid crystal display (LCD), said system comprising:
   an LCD which faces an intended observer and contains a backlight;
   a glass substrate placed between the LCD and the intended observer;
   an air gap defined between the LCD and the glass substrate;
   a plenum in gaseous communication with the air gap;
   a first fan positioned to force isolated gas through the plenum and air gap;
   a second fan positioned to force ambient gas over the plenum and behind the backlight; and
   a pyrolytic electrically conductive coating disposed on a surface of the glass substrate.

8. The system of claim 7 wherein:
said glass substrate having a pyrolytic electrically conductive coating has a sheet resistance between 10 and 20 Ohms/sq.

9. The system of claim 7 wherein:
said glass substrate having a pyrolytic electrically conductive coating has a sheet resistance between 55 and 75 Ohms/sq.

10. The system of claim 7 further comprising:
a polarizer placed between the intended observer and the glass substrate.

11. The system of claim 10 further comprising:
an anti-reflective layer placed between the intended observer and the polarizer.

12. The system of claim 11 wherein said anti-reflective glass has a reflectance percentage of 1.0 - 3.0 percent.

* * * * *